US009355745B2

(12) United States Patent
Anzou (10) Patent No.: US 9,355,745 B2
(45) Date of Patent: May 31, 2016

(54) BIST CIRCUIT

(71) Applicant: Kabushiki Kaisha Toshiba, Minato-ku, Tokyo (JP)

(72) Inventor: Kenichi Anzou, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 131 days.

(21) Appl. No.: 14/196,220

(22) Filed: Mar. 4, 2014

(65) Prior Publication Data

US 2015/0074475 A1   Mar. 12, 2015

(30) Foreign Application Priority Data

Sep. 11, 2013 (JP) ................................. 2013-188145

(51) Int. Cl.
*G11C 29/00* (2006.01)
*G11C 29/18* (2006.01)
*G11C 29/36* (2006.01)
G11C 29/04 (2006.01)

(52) U.S. Cl.
CPC ................ *G11C 29/18* (2013.01); *G11C 29/36* (2013.01); *G11C 2029/0405* (2013.01); *G11C 2029/3602* (2013.01)

(58) Field of Classification Search
None
See application file for complete search history.

(56) References Cited

U.S. PATENT DOCUMENTS

| 5,844,914 | A * | 12/1998 | Kim ........................ G11C 29/18 714/718 |
| 6,523,135 | B1 | 2/2003 | Nakamura |
| 6,941,499 | B1 * | 9/2005 | Sung .................... G06F 17/5022 703/15 |
| 7,206,984 | B2 | 4/2007 | Anzou |
| 2002/0184578 | A1 | 12/2002 | Yoshizawa |
| 2004/0125667 | A1 | 7/2004 | Sadakata et al. |
| 2005/0278595 | A1 | 12/2005 | Anzou |
| 2007/0124628 | A1 * | 5/2007 | Price ....................... G11C 29/44 714/718 |
| 2009/0116321 | A1 | 5/2009 | Shirur et al. |
| 2014/0237307 | A1 * | 8/2014 | Kobla .................... G11C 29/18 714/723 |

FOREIGN PATENT DOCUMENTS

| JP | 2000-076894 A | 3/2000 |
| JP | 2000-163990 A | 6/2000 |
| JP | 2002-358797 A | 12/2002 |

(Continued)

OTHER PUBLICATIONS

Japanese Office Action issued on Jan. 22, 2016 in counterpart Japanese patent application No. 2013-188145, along with English translation.

*Primary Examiner* — Daniel McMahon
(74) *Attorney, Agent, or Firm* — White & Case LLP (57) ABSTRACT

The BIST circuit includes an address data converting circuit that receives the logical address signal, the logical data signal, and the logical expected value signal. The address data converting circuit converts the logical data according to a physical configuration in the memory so as to generate a physical data signal specifying physical data to be written into the memory. The address data converting circuit converts the logical address according to the physical configuration in the memory so as to generate a physical address signal specifying a physical address of the memory for the physical data. The address data converting circuit converts the logical expected value according to the physical configuration in the memory so as to generate a physical expected value signal specifying a physical expected value that is an expected value of read data of the memory for the physical data.

20 Claims, 7 Drawing Sheets

(56) References Cited

FOREIGN PATENT DOCUMENTS

| JP | 2004-071020 A | 3/2004 |
| JP | 2005-141794 A | 6/2005 |
| JP | 2005-353241 A | 12/2005 |
| JP | 2007-188560 A | 7/2007 |
| JP | 2013-200911 A | 10/2013 |

* cited by examiner

| ADDRESS ORDER | A2 | A1 | A0 |
|---|---|---|---|
| 1 | 0 | 0 | 0 |
| 2 | 0 | 0 | 1 |
| 3 | 0 | 1 | 0 |
| 4 | 0 | 1 | 1 |
| 5 | 1 | 0 | 0 |
| 6 | 1 | 0 | 1 |
| 7 | 1 | 1 | 0 |
| 8 | 1 | 1 | 1 |

FIG. 3

| ADDRESS ORDER | A2 | A1 | A0 | E0 |
|---|---|---|---|---|
| 1 | 0 | 0 | 0 | 0 |
| 2 | 0 | 0 | 0 | 1 |
| 3 | 0 | 0 | 1 | 0 |
| 4 | 0 | 1 | 1 | 1 |
| 5 | 0 | 1 | 0 | 0 |
| 6 | 0 | 1 | 0 | 1 |
| 7 | 0 | 1 | 1 | 0 |
| 8 | 0 | 0 | 1 | 1 |
| 9 | 1 | 0 | 0 | 0 |
| 10 | 1 | 0 | 0 | 1 |
| 11 | 1 | 0 | 1 | 0 |
| 12 | 1 | 1 | 1 | 1 |
| 13 | 1 | 1 | 0 | 0 |
| 14 | 1 | 1 | 0 | 1 |
| 15 | 1 | 1 | 1 | 0 |
| 16 | 1 | 1 | 1 | 1 |

FIG. 4

| ADDRESS ORDER | A2P | A1P | A0P |
|---|---|---|---|
| 1 | 0 | 0 | 0 |
| 2 | 0 | 0 | 1 |
| 3 | 0 | 0 | 1 |
| 4 | 0 | 0 | 0 |
| 5 | 0 | 1 | 0 |
| 6 | 0 | 1 | 1 |
| 7 | 0 | 1 | 1 |
| 8 | 1 | 0 | 0 |
| 9 | 1 | 0 | 0 |
| 10 | 1 | 0 | 1 |
| 11 | 1 | 1 | 1 |
| 12 | 1 | 1 | 0 |
| 13 | 1 | 1 | 0 |
| 14 | 1 | 1 | 1 |
| 15 | 1 | 1 | 1 |
| 16 | 1 | 1 | 0 |

| OPERATION | DATA | FLAG |
|---|---|---|
| READ | 0 | 1 |
| WRITE | 1 | 1 |
| READ | 1 | 1 |

FIG. 7

BIST CIRCUIT

CROSS-REFERENCE TO RELATED APPLICATION

This application is based upon and claims the benefit of priority from the prior Japanese Patent Application No. 2013-188145, filed on Sep. 11, 2013, the entire contents of which are incorporated herein by reference.

BACKGROUND

1. Field

Embodiments described herein relate generally to a BIST circuit.

2. Background Art

In a conventional method, a built-in self-test circuit (hereinafter, will be called a BIST circuit) is incorporated into a memory device built in a semiconductor integrated circuit and a failure is detected during a manufacturing test.

Failure detecting methods includes a comparator BIST in which written data and read data are compared with each other to decide the presence or absence of failures and a compressor BIST in which read results are compressed in a BIST circuit and the presence or absence of failures is decided based on the compressed results.

If a test sequence is generated with a complicated address transition in such a conventional BIST circuit, a circuit configuration for generating the test sequence needs to be more complicated.

DETAILED DESCRIPTION

A BIST circuit, according to an embodiment, conducts a test on a memory provided in a semiconductor integrated circuit or a memory provided outside the semiconductor integrated circuit. The BIST circuit includes a test sequence generating circuit that generates a logical address signal specifying a logical address according to a test sequence to be executed, a logical data signal specifying logical data that is written data corresponding to the logical address, and a logical expected value signal specifying a logical expected value that is an expected value of read data corresponding to the logical address. The BIST circuit includes an address data converting circuit that receives the logical address signal, the logical data signal, and the logical expected value signal, converts the logical data according to a physical configuration in the memory so as to generate a physical data signal specifying physical data to be written into the memory, converts the logical address according to the physical configuration in the memory so as to generate a physical address signal specifying a physical address of the memory for the physical data, and converts the logical expected value according to the physical configuration in the memory so as to generate a physical expected value signal specifying a physical expected value that is an expected value of read data of the memory for the physical data. The BIST circuit includes an output analyzing circuit that receives the logical expected value signal and an output data signal specifying output data obtained by reading, from the memory, the physical data written at the physical address specified by the physical address signal in the memory, compares the output data and the physical expected value, and outputs an analysis result signal obtained by analyzing presence or absence of a failure in the memory based on a comparison result.

The address data converting circuit converts an address order of the logical address so as to physically execute the test sequence on the memory, and converts a value of the logical data so as to physically write and read a desired value to and from the memory.

In the following, embodiments will be described with reference to the drawings.

First Embodiment

Figure 1:
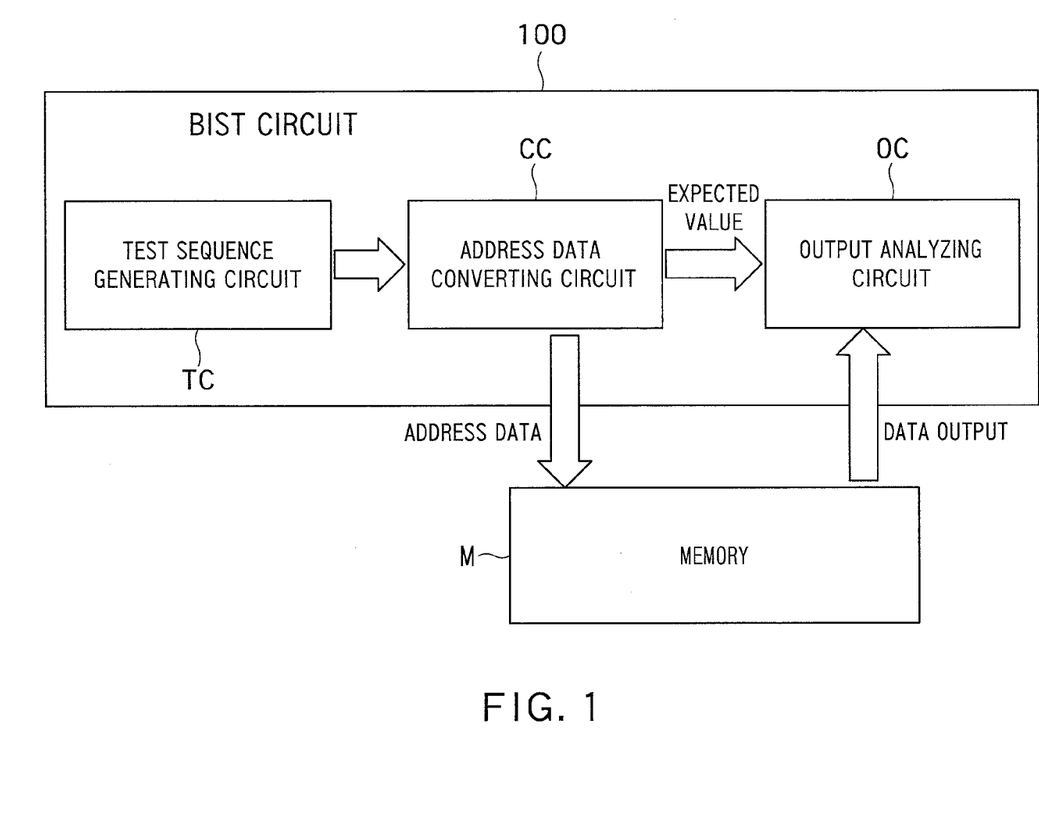
FIG. 1 is a block diagram showing an example of the configuration of a part of a BIST circuit according to a first embodiment.
Figure 2:
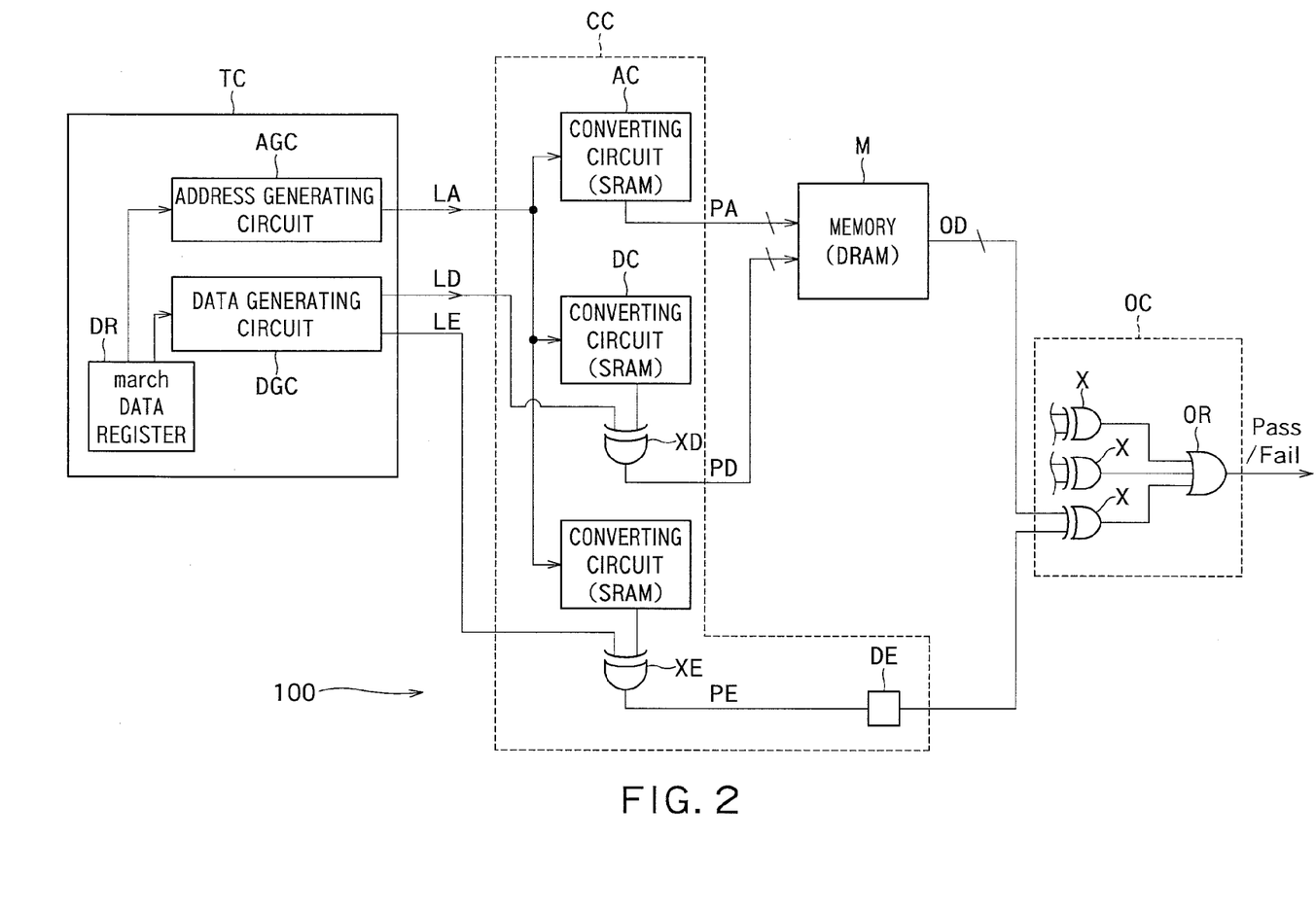
FIG. 2 is a block diagram showing an example of a specific configuration of the BIST circuit 100 illustrated in FIG. 1.

FIG. 1 is a block diagram showing an example of the configuration of a part of a BIST circuit according to a first embodiment. FIG. 2 is a block diagram showing an example of a specific configuration of the BIST circuit 100 illustrated in FIG. 1.

As shown in FIGS. 1 and 2, the BIST circuit 100 conducts a test on a memory M provided in a semiconductor integrated circuit (not shown) or a memory M provided outside the semiconductor integrated circuit (not shown).

As shown in FIG. 2, the memory M is, for example, DRAM. The memory M in FIG. 2 writes physical data, which is specified by a physical data signal PD, in a writing operation at a physical address specified by a physical address signal PA depending on the write-enable signal. The memory M in a reading operation reads physical data written at a physical address specified by the physical address signal PA (in other words, the memory M outputs an output data signal OD that specifies read output data) depending on the read-enable signal.

As shown in FIGS. 1 and 2, the BIST circuit 100 includes, for example, a test sequence generating circuit TC, an address data converting circuit CC, and an output analyzing circuit OC.

As shown in FIG. 2, according to a test sequence to be executed, the test sequence generating circuit TC generates a logical address signal LA specifying a logical address, a logical data signal LD specifying logical data that is written data corresponding to the logical address, and a logical expected value signal LE specifying a logical expected value that is an expected value of read data corresponding to the logical address. The test sequence generating circuit TC further generates address corresponding to the bits of the extended address.

As shown in FIG. 2, the test sequence generating circuit TC includes, for example, an address generating circuit AGC, a data generating circuit DGC, and a March data register (memory circuit) DR.

The March data register DR stores, for example, information specifying a test sequence (a writing operation, a reading operation, data in a writing operation, and data in a reading operation) set from the outside during a test. Moreover, the March data register DR outputs a control signal to the address generating circuit AGC and the data generating circuit DGC based on the information specifying the test sequence.

The address generating circuit AGC outputs the logical address signal LA specifying a logical address, according to the test sequence to be executed.

The data generating circuit DGC outputs the logical data signal LD specifying logical data that is written data corresponding to a logical address, according to the test sequence to be executed. Moreover, the data generating circuit DGC outputs the logical expected value signal LE specifying a logical expected value that is an expected value of read data corresponding to a logical address, according to the test sequence to be executed.

As shown in FIG. 2, the address data converting circuit CC receives the logical address signal LA, the logical data signal LD, and the logical expected value signal LE.

Furthermore, the address data converting circuit CC converts logical data according to a physical configuration (physical design structure) in the memory M, generating the physical data signal PD specifying physical data to be written into the memory M.

Moreover, the address data converting circuit CC converts a logical address according to the physical configuration in the memory M, generating the physical address signal PA specifying the physical address of the memory M for the physical data.

In this case, for the address and the data signal that are logically generated by the BIST circuit 100, the physical address signal and the physical data signal of the memory are converted such that the signals are actually written or read with an intended data value in an intended order in the physical structure of an array in a memory macro. Such conversion leads to signal changes at adjacent addresses in, for example, a March test, thereby satisfying requirements on test quality. A logical address and a physical address are not discriminated from each other on the input/output interface of the memory macro.

Moreover, the address data converting circuit CC converts a logical expected value according to the physical structure in the memory M, generating a physical expected value signal PE specifying a physical expected value that is an expected value of the read data of the memory NI for the physical data.

The address data converting circuit CC changes the order of logical addresses so as to physically execute a test sequence on the memory M. The order of addresses is set so as to make access at least once to at least one physical address. Furthermore, the address data converting circuit CC converts a logical data value so as to physically write a desired value into the memory M and read the value from the memory M.

Moreover, the address data converting circuit CC converts an address, which is obtained by adding the bits of a preset extended address to the bits of a logical address, to a physical address according to the physical configuration in the memory M.

The address data converting circuit CC has a larger bit width on an address input than on the address input of the memory M.

Furthermore, the address data converting circuit CC receives information corresponding to the physical configuration of the memory M, for example, from outside during a test. The information includes a rule for converting a logical address to a physical address.

For example, as shown in FIG. 2, the address data converting circuit CC includes a converting circuit AC, a converting circuit DC, an arithmetic circuit XD, a converting circuit EC, an arithmetic circuit XE, and a delay circuit DE.

The converting circuit AC includes, for example, SRAM. The converting circuit AC receives the logical address signal LA and reads data, which is stored at a logical address specified by the logical address signal LA, as a physical address of the memory M according to physical data. Subsequently, the converting circuit AC outputs the physical address signal PA specifying the physical address.

In this case, data is stored in the converting circuit (SRAM) AC according to the physical configuration in the memory M during a test. Thus, the physical address specified by the physical address signal PA is set at a value converted from a logical address according to the physical configuration in the memory M.

The converting circuit DC includes, for example, SRAM. The converting circuit DC receives the logical address signal LA and then reads and outputs data stored at a logical address specified by the logical address signal LA. The converting circuit DC may receive the physical address signal PA and then read and output data stored at a physical address specified by the physical address signal PA.

As shown in FIG. 2, the arithmetic circuit XD is, for example, an exclusive OR circuit. The arithmetic circuit XD receives the output signal of the converting circuit DC and the logical data signal LD and then performs an operation (exclusive OR operation) on the data of the output signal from the converting circuit DC and logical data. Subsequently, the arithmetic circuit XD outputs a signal specifying data obtained by the operation result, as the physical data signal PD specifying physical data. As described above, the converting circuit DC and the arithmetic circuit XD function as a data converting circuit.

In this case, data is stored in the converting circuit (SRAM) DC according to the physical configuration in the memory M during a test. Thus, physical data specified by the physical data signal DA is set at a value converted from logical data according to the physical configuration in the memory M.

The converting circuit EC includes, for example, SRAM. The converting circuit EC receives the logical expected value signal LE and then reads and outputs data stored at a logical address specified by the logical address signal LE. If the converting circuit DC receives the physical address signal PA as has been discussed, the converting circuit EC is set so as to similarly receive the physical address signal PA and then read and output data stored at a physical address specified by the physical address signal PA.

As shown in FIG. 2, the arithmetic circuit XE is, for example, an exclusive OR circuit. The arithmetic circuit XE receives the output signal of the converting circuit EC and the logical expected value signal LE and then performs an operation (exclusive OR operation) on the data of the output signal of the converting circuit EC and a logical expected value. Subsequently, the arithmetic circuit XE outputs a signal specifying data obtained by the operation result, as the physical expected value signal PE specifying a physical expected value. As described above, the converting circuit EC and the arithmetic circuit XE function as a data converting circuit.

The converting circuit (SRAM) EC stores data according to the physical configuration in the memory M during a test. Thus, the physical expected value specified by the physical expected value signal PE is set at an expected value converted from a logical expected value according to the physical configuration in the memory M.

The delay circuit DE delays the physical expected value signal PE by a predetermined time. The delay time is set based on the data reading time of the memory M (for example, as long as the data reading time). As shown in FIG. 2, the delay circuit DE is, for example, a register.

The output analyzing circuit OC receives the output data signal OD specifying output data and the physical expected value signal PE. The output data is physical data that is written at a physical address of the memory M and is read from the memory M, the physical address being specified by the physical address signal PA.

The output analyzing circuit OC compares the output data read from the memory M and the physical expected value, and outputs an analysis result signal obtained by analyzing the presence or absence of a failure in the memory M based on the comparison result.

For example, if the physical expected value does not match the output data, the output analyzing circuit OC outputs the analysis result signal specifying the presence of a failure (fail) in the memory M.

If the physical expected value matches the output data, the output analyzing circuit OC outputs the analysis result signal specifying the absence of a failure (pass) in the memory M.

As shown in FIG. 2, the output analyzing circuit OC includes, for example, a plurality of exclusive OR circuits X and an OR circuit OR.

The exclusive OR circuits X are provided at the respective output bit positions of the memory M. Each of the exclusive OR circuits X receives the output data signal OD corresponding to the same physical address and the physical expected value signal PE, and outputs a signal corresponding to an exclusive OR operation result.

Subsequently, the OR circuit OR performs an exclusive OR operation on the signals outputted from the exclusive OR circuits X and then outputs the operation result. For example, if at least one segment of the output data does not match the physical expected value, the OR circuit OR outputs a logic (e.g., "1") specifying the presence of a failure (fail) in the memory M, whereas if all the segments of the output data match the physical expected value, the OR circuit OR outputs a logic (e.g., "0") specifying the absence of a failure (pass) in the memory M.

An example of an operation of the BIST circuit 100 configured thus will be described below.

As has been discussed, the test sequence generating circuit TC generates the logical address signal LA specifying a logical address according to a test sequence to be executed, the logical data signal LD specifying logical data that is written data corresponding to a logical address, and the logical expected value signal LE specifying a logical expected value that is an expected value of read data corresponding to a logical address.

The address data converting circuit CC generates the physical data signal PD specifying physical data to be written into the memory M. The physical data signal PD is generated by converting logical data according to the physical configuration (physical design configuration) in the memory M. Moreover, the address data converting circuit CC generates the physical address signal PA specifying the physical address of the memory M for the physical data. The physical address signal PA is generated by converting a logical address according to the physical configuration in the memory M. Furthermore, the address data converting circuit CC generates the physical expected value signal PE specifying a physical expected value that is an expected value of read data of the memory for the physical data. The physical expected value signal PE is generated by converting a logical expected value according the physical configuration in the memory M.

Figure 3:
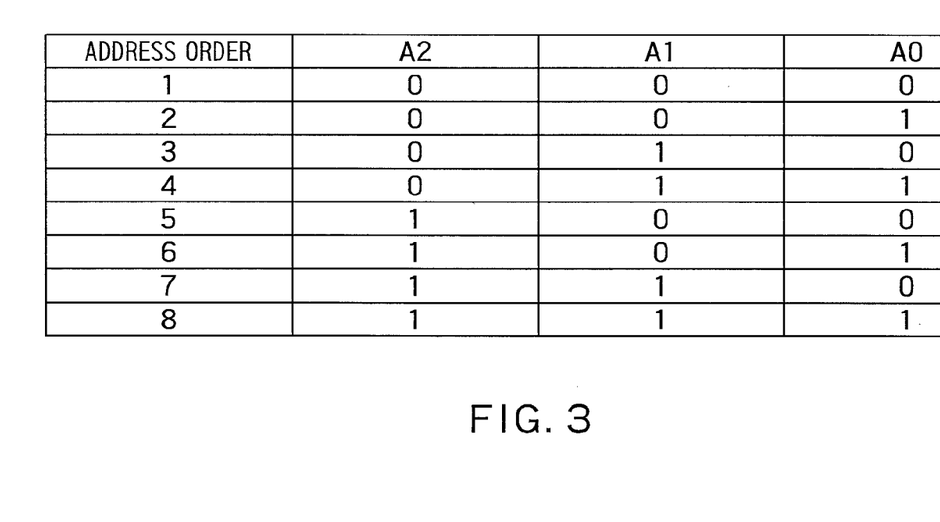
FIG. 3 shows an example of the relationship between logical addresses A0 to A2 and the order of addresses.
Figure 4:
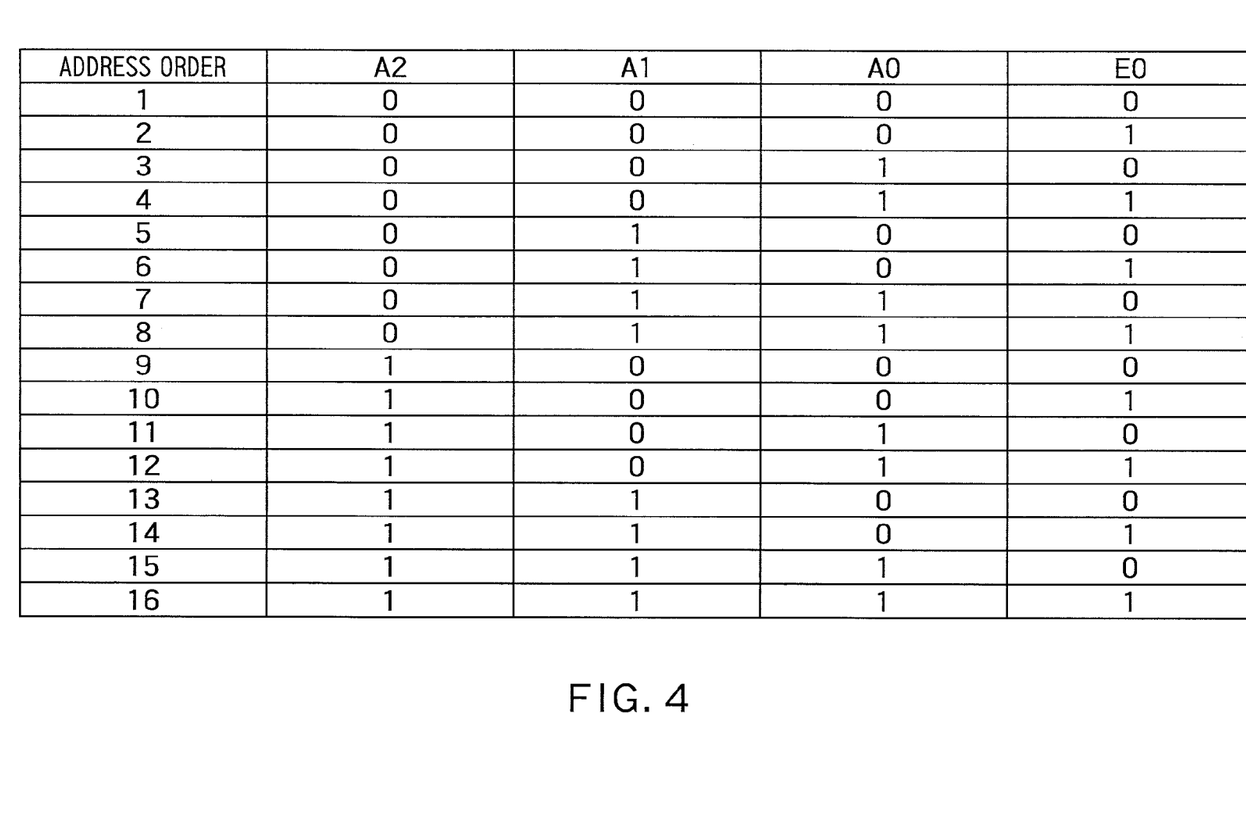
FIG. 4 is a figure showing an example of the relationship between the order of addresses and an address obtained by adding the bits of a preset extended address E0 to the bits of the logical addresses A0 to S2 in FIG. 3.
Figure 5:
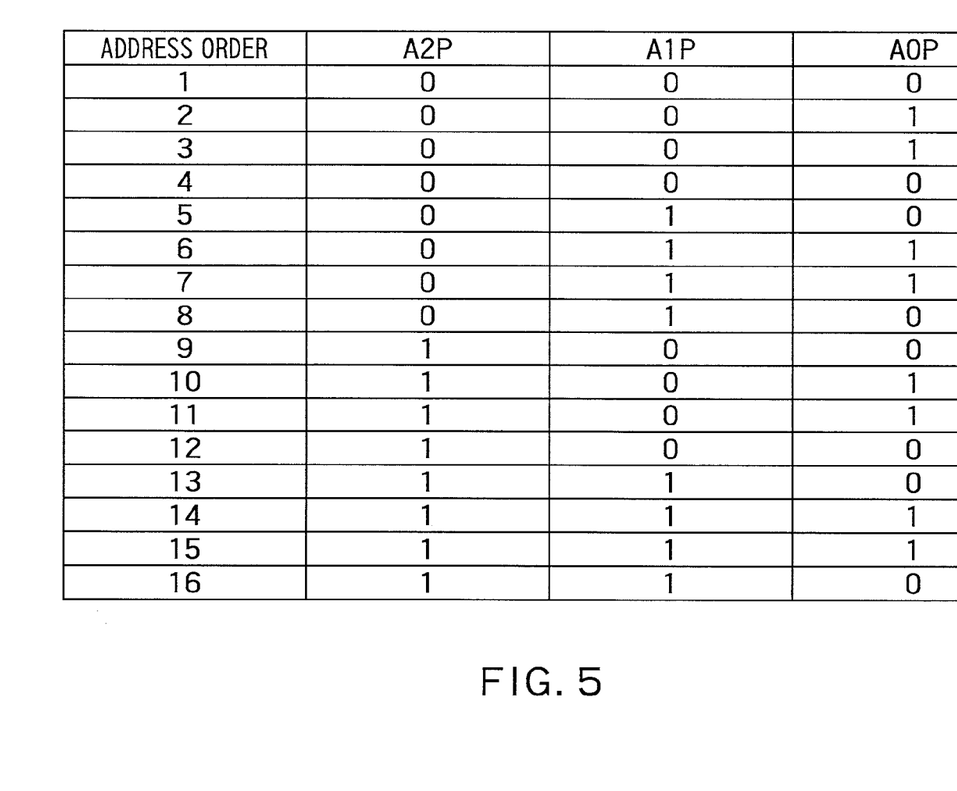
FIG. 5 is a figure showing an example of the relationship between the order of addresses and physical addresses A0P to A2P obtained by converting the addresses in FIG. 4 according to the physical configuration in the memory M.

FIG. 3 shows an example of the relationship between logical addresses A0 to A2 and the order of addresses. FIG. 4 shows an example of the relationship between the order of addresses and an address obtained by adding the bits of a preset extended address E0 to the bits of the logical addresses A0 to S2 in FIG. 3. FIG. 5 shows an example of the relationship between the order of addresses and physical addresses A0P to A2P obtained by converting the addresses in FIG. 4 according to the physical configuration in the memory M.

For example, inputs to the 3-bit addresses A2, A1, and A0 are sequentially generated from above as in FIG. 3 when being logically counted.

In the case of a 1-bit extended address, for example, inputs are made to the addresses obtained by adding the bits of the preset extended address E0 to the bits of the logical addresses A0 to A2 in FIG. 3. These inputs are sequentially generated from above as in FIG. 4 when being logically counted.

The address data converting circuit CC receives all the address bits shown in FIG. 4 and generates physical address information, which is the address input of the memory M, according to the physical configuration (physical design structure) of the memory M.

FIG. 5 shows an example of the relationship between the order of addresses and the physical addresses A0P to A2P obtained by converting the addresses in FIG. 4 according to the physical configuration in the memory M.

Address conversion formulas for FIG. 5 are shown below. The conversion formulas are set according to the physical configuration (physical design structure) in the memory M. The conversion formulas may be provided in a logic circuit or the table of FIG. 5 may be extended in the SRAM.

$$A2P=A2$$

$$A1P=A1$$

$$A0P=A0\textasciicircum E0 \text{ ("}\textasciicircum\text{" is an exclusive OR)}$$

As shown in FIG. 5, some of the logical addresses and the physical addresses have many-to-one relationships in address conversion, thereby generating the same address several times.

In other words, a test sequence for accessing the same address several times can be generated for the memory M. The BIST circuit 100 can generate a complicated test sequence without adding complicated functions to the test sequence generating circuit.

Furthermore, corresponding formulas are inputted from the outside during a test to make the address data converting circuit configurable, thereby responding to any physical configuration of the external memory M.

According to the present embodiment, when the embedded memory M of the semiconductor integrated circuit or the external memory M is tested by a BIST circuit, a physical scramble converting circuit for address data is provided with an extended range of addresses. This can generate a test sequence over a wider range with a simpler circuit than in programming of a signal change.

As has been discussed, the BIST circuit according to the first embodiment can generate a test sequence over a wider range while achieving a simple circuit configuration.

Second Embodiment

Figure 6:
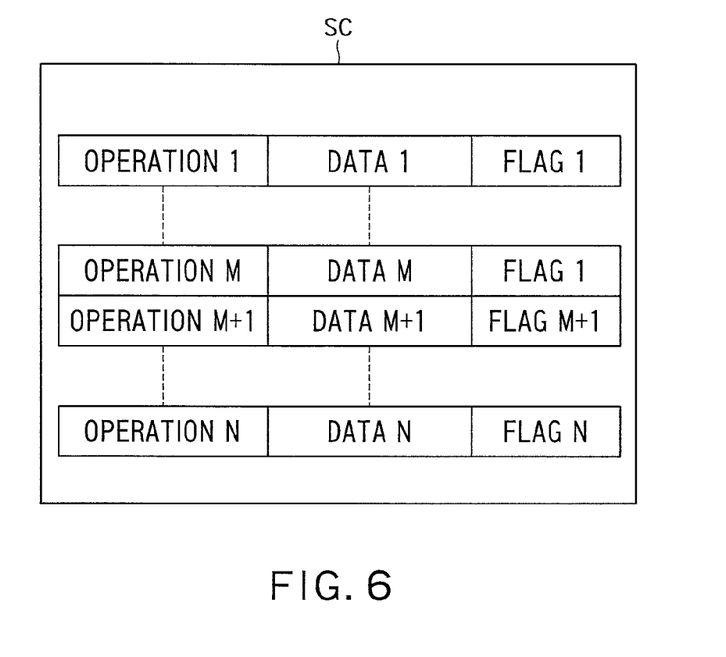
FIG. 6 is a figure showing an example of a configuration of the March data register (memory circuit) DR in FIG. 2.

FIG. 6 shows an example of a configuration of the March data register (memory circuit) DR in FIG. 2.

As shown in FIG. 6, the March data register DR stores sets of setting codes (operations 1 to M, M+1 to N) of a writing operation or a reading operation for accessing the memory M, logical data serving as written data or logical expected values (data 1 to M, M+1 to N) serving as read data in access, and flag information (flags 1 to M, M+1 to N) for setting whether extended address bits are used or not.

If the flag information specifies the use of the bits of the extended address (for example, logic "1"), the address data converting circuit CC converts an address obtained by adding the bits of the extended address to the bits of the logical address, to the physical address according to the physical configuration in the memory M.

If the flag information specifies the disuse of the bits of the extended address (for example, logic "0"), the address data converting circuit CC converts an address obtained without adding the bits of the extended address to the bits of the logical address, to the physical address according to the physical configuration in the memory M.

Subsequently, the BIST circuit 100 sequentially performs accessing operations (a writing operation, a reading operation) on the memory M according to the setting codes in the order of physical address generated by the address data converting circuit CC.

For example, the flag information is inputted to the March data register DR from the outside during a test.

Figure 7:
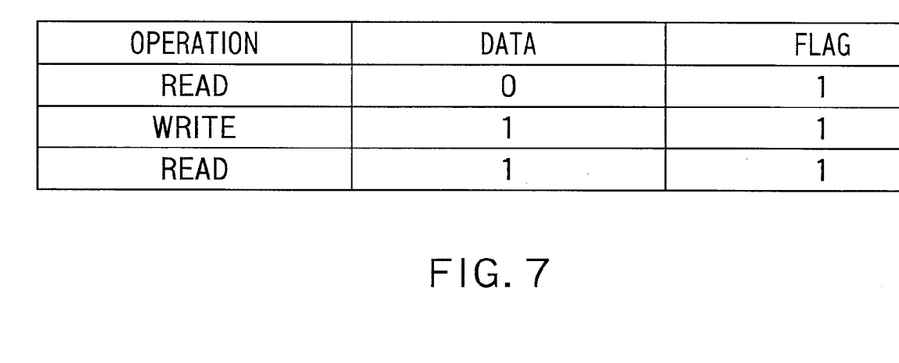
FIG. 7 is a figure showing an example of the setting of March data.

FIG. 7 shows an example of the setting of March data.

If the setting of March data in FIG. 7 is combined with an address transition in FIG. 6, operations with READ "0", WRITE "1", and READ "0" are sequentially performed on physical addresses 1 to 16.

At this point, the same physical address appears twice. Thus, a writing operation and a reading operation are each performed twice at a certain physical address.

As has been discussed, if the flag information is set at "0", an extended address is not accessed but physical addresses are sequentially accessed one-by-one at each address.

In this way, the input of the address data converting circuit CC is provided with an extended address portion. Thus, a test sequence can be generated over a wider range without the need for a complicated change of the BIST circuit 100 relative to the memory M.

Other configurations and functions are similar to those of the BIST circuit 100 according to the first embodiment.

In other words, the BIST circuit according to the second embodiment can generate a test sequence over a wider range with a simple circuit configuration.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A BIST (Built-In Self-Test) circuit that conducts a test on a memory provided in a semiconductor integrated circuit or a memory provided outside the semiconductor integrated circuit, the BIST circuit comprising:
a test sequence generating circuit that generates a logical address signal specifying a logical address according to a test sequence to be executed, a logical data signal specifying logical data that is written data corresponding to the logical address, and a logical expected value signal specifying a logical expected value that is an expected value of read data corresponding to the logical address;

an address data converting circuit that receives the logical address signal, the logical data signal, and the logical expected value signal, converts the logical data according to a physical configuration in the memory so as to generate a physical data signal specifying physical data to be written into the memory, converts the logical address according to the physical configuration in the memory so as to generate a physical address signal specifying a physical address of the memory for the physical data, and converts the logical expected value according to the physical configuration in the memory so as to generate a physical expected value signal specifying a physical expected value that is an expected value of read data of the memory for the physical data; and an output analyzing circuit that receives the physical expected value signal and an output data signal specifying output data obtained by reading, from the memory, the physical data written at the physical address specified by the physical address signal in the memory, compares the output data and the physical expected value, and outputs an analysis result signal obtained by analyzing presence or absence of a failure in the memory based on a comparison result, wherein the address data converting circuit converts an address order of the logical address so as to physically execute the test sequence on the memory, and converts a value of the logical data so as to physically write and read a desired value to and from the memory.

2. The BIST circuit according to claim 1, wherein the BIST circuit generates a logical address data with extended one or more logical address bits added to an original logical address, and the address data converting circuit converts the input logical address data with the extended bits to the physical address according to the physical configuration in the memory.

3. The BIST circuit according to claim 1, wherein the address data converting circuit has a larger bit width on an address input than on an address input of the memory.

4. The BIST circuit according to claim 2, wherein the address data converting circuit has a larger bit width on an address input than on an address input of the memory.

5. The BIST circuit according to claim 1, wherein the address data converting circuit receives, from a test equipment outside the semiconductor integrated circuit, information corresponding to the physical configuration of the memory as a rule for conversion of the logical address to the physical address.

6. The BIST circuit according to claim 2, wherein the address data converting circuit receives, from a test equipment outside the semiconductor integrated circuit, information corresponding to the physical configuration of the memory as a rule for conversion of the logical address to the physical address.

7. The BIST circuit according to claim 3, wherein the address data converting circuit receives, from a test equipment outside the semiconductor integrated circuit, information corresponding to the physical configuration of the memory as a rule for conversion of the logical address to the physical address.

8. The BIST circuit according to claim 1, wherein the test sequence generating circuit comprises a storage circuit such as registers that stores sets of codes which indicates operations of writing or reading access to the memory and data values used by the test sequence generating circuit to generate logical data and the logical expected value.

9. The BIST circuit according to claim 2, wherein the test sequence generating circuit comprises a storage circuit such as registers that stores sets of codes which indicates operations of writing or reading access to the memory and data values used by the test sequence generating circuit to generate logical data and the logical expected value.

10. The BIST circuit according to claim 3, wherein the test sequence generating circuit comprises a storage circuit such as registers that stores sets of codes which indicates operations of writing or reading access to the memory and data values used by the test sequence generating circuit to generate logical data and the logical expected value.

11. The BIST circuit according to claim 8, wherein the storage circuit stores flag information that sets whether bits of an extended address are used or not,
the test sequence generating circuit further generates address corresponding to the bits of the extended address,
if the flag information specifies use of the bits of the extended address, the address data converting circuit converts an address, which is obtained by adding the bits of the extended address to bits of the logical address, to the physical address according to the physical configuration in the memory, and
if the flag information specifies disuse of the bits of the extended address, the address data converting circuit converts an address, which is obtained without adding the bits of the extended address to the bits of the logical address, to the physical address according to the physical configuration in the memory.

12. The BIST circuit according to claim 11, wherein the flag information is inputted to the storage circuit from a test equipment outside the semiconductor integrated circuit.

13. The BIST circuit according to claim 8, wherein the storage circuit stores flag information that sets whether bits of an extended address are used or not,
the test sequence generating circuit further generates address corresponding to the bits of the extended address,
if the flag information specifies use of the bits of the extended address, the address data converting circuit converts an address, which is obtained by adding the bits of the extended address to bits of the logical address, to the physical address according to the physical configuration in the memory, and
if the flag information specifies disuse of the bits of the extended address, the address data converting circuit converts an address, which is obtained without adding the bits of the extended address to the bits of the logical address, to the physical address according to the physical configuration in the memory.

14. The BIST circuit according to claim 13, wherein the flag information is inputted to the storage circuit from a test equipment outside the semiconductor integrated circuit.

15. The BIST circuit according to claim 8, wherein the storage circuit stores flag information that sets whether bits of an extended address are used or not,
the test sequence generating circuit further generates address corresponding to the bits of the extended address,
if the flag information specifies use of the bits of the extended address, the address data converting circuit converts an address, which is obtained by adding the bits of the extended address to bits of the logical address, to the physical address according to the physical configuration in the memory, and
if the flag information specifies disuse of the bits of the extended address, the address data converting circuit converts an address, which is obtained without adding the bits of the extended address to the bits of the logical address, to the physical address according to the physical configuration in the memory.

16. The BIST circuit according to claim 15, wherein the flag information is inputted to the storage circuit from a test equipment outside the semiconductor integrated circuit.

17. A BIST (Built-In Self-Test) circuit that conducts a test on a memory provided in a semiconductor integrated circuit or a memory provided outside the semiconductor integrated circuit,
the BIST circuit comprising:
a test sequence generating circuit that generates a logical address signal specifying a logical address according to a test sequence to be executed, a logical data signal specifying logical data that is written data corresponding to the logical address, and a logical expected value signal specifying a logical expected value that is an expected value of read data corresponding to the logical address;
an address data converting circuit that receives the logical address signal, the logical data signal, and the logical expected value signal, converts the logical data according to a physical configuration in the memory so as to generate a physical data signal specifying physical data to be written into the memory, converts the logical address according to the physical configuration in the memory so as to generate a physical address signal specifying a physical address of the memory for the physical data, and converts the logical expected value according to the physical configuration in the memory so as to generate a physical expected value signal specifying a physical expected value that is an expected value of read data of the memory for the physical data; and
an output analyzing circuit that receives the physical expected value signal and an output data signal specifying output data obtained by reading, from the memory, the physical data written at the physical address specified by the physical address signal in the memory, compares the output data and the physical expected value, and outputs an analysis result signal obtained by analyzing presence or absence of a failure in the memory based on a comparison result.

18. The BIST circuit according to claim 17, wherein the address data converting circuit converts an address, which is obtained by adding bits of a preset extended address to bits of the logical address, to the physical address according to the physical configuration in the memory.

19. The BIST circuit according to claim 17, wherein the address data converting circuit has a larger bit width on an address input than on an address input of the memory.

20. The BIST circuit according to claim 18, wherein the address data converting circuit has a larger bit width on an address input than on an address input of the memory.

* * * * *